United States Patent
Yokoyama et al.

(10) Patent No.: US 10,607,533 B2
(45) Date of Patent: Mar. 31, 2020

(54) DISPLAY APPARATUS WITH LIGHT EMITTING PORTIONS

(71) Applicant: KYOCERA Corporation, Kyoto-shi, Kyoto (JP)

(72) Inventors: Ryoichi Yokoyama, Kakogawa (JP); Sumio Kato, Yamatokoriyama (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 16/053,871

(22) Filed: Aug. 3, 2018

(65) Prior Publication Data

US 2020/0043401 A1 Feb. 6, 2020

(51) Int. Cl.
*G09G 3/32* (2016.01)
*H01L 27/12* (2006.01)

(52) U.S. Cl.
CPC .............. *G09G 3/32* (2013.01); *H01L 27/124* (2013.01); *G09G 2300/0408* (2013.01); *G09G 2310/0267* (2013.01); *G09G 2310/08* (2013.01)

(58) Field of Classification Search
CPC ........... G02F 1/13454; G02F 1/136227; H01L 27/124; G09G 2300/0408; G09G 2310/0297
See application file for complete search history.

(56) References Cited

U.S. PATENT DOCUMENTS

| | | | |
|---|---|---|---|
| 2008/0137021 A1* | 6/2008 | Choi | G02F 1/1345 349/150 |
| 2009/0079464 A1* | 3/2009 | Yoshii | G02F 1/136204 324/760.01 |
| 2016/0064423 A1* | 3/2016 | Furukawa | H01L 27/1248 257/66 |

FOREIGN PATENT DOCUMENTS

| | | | | |
|---|---|---|---|---|
| JP | 11-224774 A | 8/1999 | | |
| JP | 4407464 B2 * | 2/2010 | | G06F 9/30 |
| JP | 2016-186649 A | 10/2016 | | |

* cited by examiner

*Primary Examiner* — Yuzhen Shen
(74) *Attorney, Agent, or Firm* — Volpe and Koenig, P.C.

(57) ABSTRACT

A display apparatus includes: a substrate having a first principal surface and a second principal surface opposite to the first principal surface; light-emitting portions disposed on a first principal surface side; a time-division driving circuit which is disposed on the first principal surface side, and outputs a light-emission control signal to the light-emitting portions via respective light-emission control signal lines in a time-division manner; a driving signal line which is disposed on a second principal surface side, and feeds the light-emission control signal to the light-emitting portions via the time-division driving circuit; and a connection conductor which extends from the first principal surface to the second principal surface, and electrically connects the time-division driving circuit and the driving signal line. A number of the connection conductor is smaller than a number of the light-emission control signal lines by electrically connecting the one connection conductor to the light-emission control signal lines.

4 Claims, 7 Drawing Sheets

DISPLAY APPARATUS WITH LIGHT EMITTING PORTIONS

BACKGROUND OF THE INVENTION

1. Field of the Invention

The present invention relates to a display apparatus in which a pixel portion includes a light-emitting device such as an LED (Light Emitting Diode).

2. Description of the Related Art

There is a heretofore known backlight-free display apparatus of self-emitting type comprising a plurality of pixel portions each including a light-emitting device such as an LED. FIG. 5 shows a block circuit diagram of the basic structure of such a display apparatus. The display apparatus comprises a substrate 51 composed of, for example, a glass substrate, on which are arranged many light-emitting portions (also referred to as pixel portions) 74 (P11, P12, P13, P21, P22, P23, P31, P32, P33 . . . ) each including a TFT (Thin Film Transistor) 71 which serves as a switching device for inputting light emission signals to each of light-emitting devices 73 (LD11, LD12, LD13, LD21, LD22, LD23, LD31, LD32, LD33 . . . ) and a TFT 72 which serves as a driving device for effecting current drive to the light-emitting device 73 on the basis of a potential difference between positive voltage (anode voltage of about 3 to 5 V) and negative voltage (cathode voltage of about −3 to 0 V) (light emission signal) responsive to the level (voltage) of a light-emission control signal (a signal which is transmitted through an image signal line SL).

The TFT 71 and the TFT 72 are each a p-channel TFT. Inputting of a low (L) signal to their gate electrodes effects source-to-drain conduction, thus switching the TFT to the ON state for the passage of electric current. In the TFT 72, its gate electrode receives input of a light-emission control signal, and, a potential difference (light emission signal) responsive to the level of the light-emission control signal is applied across the positive electrode (anode electrode) and the negative electrode (cathode electrode) of the light-emitting device 73. A positive voltage is inputted via a positive-voltage input line 75 to the positive electrode of the light-emitting device 73, and, a negative voltage is inputted via a negative-voltage input line 76 to the negative electrode of the light-emitting device 73. At the input end of the positive-voltage input line 75, there is provided a through conductor 78 comprising a through hole, etc. via which the positive-voltage input line 75 is electrically connected to a driving device 60 or a power supply section, etc. disposed on the back side of the substrate 51. At the input end of the negative-voltage input line 76, there is provided a through conductor 79 comprising a through hole, etc. via which the negative-voltage input line 76 is electrically connected to a driving device 60 or a power supply section, etc. disposed on the back side of the substrate 51. The TFT 72 is maintained in the ON state during the time the L signal is inputted to the gate electrode to allow the passage of electric current through the light-emitting device 73. Moreover, on a connection line for providing connection between the gate electrode and the source electrode of the TFT 72, there is provided a capacitive element which serves as a retention capacity for retaining the voltage of the light-emission control signal inputted to the gate electrode of the TFT 72 over a certain period of time until initiation of succeeding rewriting operation (one-frame period).

Moreover, on the substrate 51, there are provided a plurality of gate signal lines 52 (GL1, GL2, GL3, . . . ) each extending in a first direction (row direction, for example), a plurality of image signal lines (source signal lines) 53 (SL1, SL2, SL3, . . . ) each extending in a second direction (column direction, for example) perpendicular to the first direction so as to intersect with the gate signal lines 52, and the pixel portions 74 each assigned to a part of intersection of the gate signal line 52 and the image signal line 53. In FIG. 5, reference numeral 70 denotes a display section, and reference numeral 60 denotes an image signal line-driving device for driving the image signal line 53 via a through conductor 64 comprising a through hole, etc. Moreover, reference numeral 61 denotes a gate signal line-driving device comprising a gate signal line-driving circuit for successively inputting gate signals to the gate signal lines 52. Reference numeral 61s denotes a through conductor comprising a through hole, etc. for transmission of a gate signal from the driving device 61 disposed on the back side of the substrate 51 via a connection line 61a. Reference numeral 66 denotes a connection line for electrically connecting an image signal input terminal TS1, TS2, TS3, . . . of the driving device 60 and the through conductor 64. For example, the driving device 60 and the driving device 61 are each mounted on the back side of the substrate 51 by means of COG (Chip On Glass) or otherwise. Moreover, there may be a case where the back side of the substrate 51 is provided with a circuit board FPC (Flexible Printed Circuit) for the inputting and outputting of a driving signal, a control signal, etc. between the substrate and the driving devices 60 and 61 via a lead wire.

For example, the TFT 71, 72 comprises a semiconductor film formed of amorphous silicon (a-Si), LIPS (Low-Temperature Poly Silicon), etc., and has three terminals, namely a gate electrode, a source electrode, and a drain electrode. The TFT serves as a switching device (transfer gate device) in which electric current is passed through the semiconductor film (channel) between the source electrode and the drain electrode under application of a voltage of predetermined potential to the gate electrode. In cases where the substrate 51 is composed of a glass substrate, and the driving devices 60 and 61 are configured as a driving circuit comprising of a TFT comprising a semiconductor film formed of LIPS, the TFT can be formed directly on the substrate 51 by a thin-film forming process such as CVD (Chemical Vapor Deposition).

There may be a case where the pixel portions 74 serving also as light-emitting portions include a subpixel for red light emission, a subpixel for green light emission, and a subpixel for blue light emission, respectively. The subpixel for red light emission comprises a red light-emitting device composed of a red LED, etc., the subpixel for green light emission comprises a green light-emitting device composed of a green LED, etc., and the subpixel for blue light emission comprises a blue light-emitting device composed of a blue LED, etc. For example, these subpixels are aligned in a column.

From the through conductor 64, a light-emission control signal is inputted, via the image signal line (also referred to as a light-emission control signal line) 53, to each light-emitting portion 74. The image signal lines 53 and the through conductors 64 are provided on a single-through conductor-per-image signal line basis. Thus, from a single through conductor 64, a light-emission control signal is inputted to corresponding one of the light-emitting portions 74 of a single selected (activated) gate signal line 52. Moreover, the driving device 60 has image signal input terminals (TS1, TS2, TS3, . . . ) corresponding to the through conductors 64, respectively.

Moreover, FIGS. 6A and 6B are views showing the display apparatus of FIG. 5, and more specifically FIG. 6A is a sectional view of the display apparatus taken along the image signal line 53 (SL1), as viewed in a direction A (indicated by an open arrow) shown in FIG. 5, and FIG. 6B is a side view of the display apparatus, as viewed in a direction B (indicated by an open arrow) shown in FIG. 6A. As shown in FIG. 6, there are provided connection portions 65, each in the form of, for example, a connection terminal (connection pad), in corresponding relation to the plurality of image signal lines 53 (SL1, SL2, SL3, . . . ), respectively. Each connection portion 65 is electrically connected, via the through conductor 64 comprising a through hole, etc., to corresponding one of the image signal input terminals (TS1, TS2, TS3, . . . ) of the driving device 60 disposed on a surface of the substrate 51 opposite the light-emitting device mounting surface thereof (back side).

As another example of the related art, there is an already known EL device comprising light-emitting portions and through holes which are provided on a single-through hole-per-light-emitting portion basis (refer to Japanese Unexamined Patent Publication JP-A 11-224774 (1999), for example). In this construction, with reference to the display apparatus shown in FIG. 5, the through conductor 64 is provided in each pixel portion corresponding to the plurality of light-emitting devices 73, respectively. That is, the light-emitting devices 73 and the through conductors 64 are equal in number.

However, the display apparatus of conventional design as disclosed in JP-A 11-224774 (1999) poses the following problem. That is, in the case of providing light-emitting portions and through holes on a single-through hole-per-light-emitting portion basis, the placement of many light-emitting portions for high-resolution displays entails a considerable increase in the number of through holes and thus in the number of wiring lines to be connected to the through holes, which results in an undesirable increase in complexity in wiring arrangement.

Furthermore, in the conventional display apparatus shown in FIGS. 5, 6A and 6B, the through hole for forming the through conductor 64, which can be formed in the glass substrate by application of laser light, is required to have a diameter of about 50 µm at the minimum. This makes it difficult to create a single through hole within the range of a width of as narrow as about 130 µm of each pixel portion 74. That is, with the arrangement of the TFT 71 and the TFT 72 in each pixel portion 74, it is very difficult to form the TFTs 71 and 72 and the through conductor 64 in proper alignment in a single pixel portion 74. This is because, in abutting the substrate 51 against a jig, etc. for positioning, a positioning error of about 50 µm or above is introduced. By the same token, it is difficult to form the through conductor 64 and the image signal line 53 in highly accurate alignment.

SUMMARY OF THE INVENTION

The invention has been completed in view of the problems as discussed supra, and accordingly an object thereof is to achieve remarkable simplification in wiring arrangement by a significant reduction in the number of through conductors for inputting light-emission control signals to light-emitting portions. Another object of the invention is to provide a display apparatus in which a through conductor and an image signal line are readily alignable with consequent enhancement of their connection, thus achieving reliable input of a light-emission control signal to the light-emitting portion.

A display apparatus according to the invention comprises: a substrate having a first principal surface and a second principal surface opposite to the first principal surface; a plurality of light-emitting portions disposed on a first principal surface side of the substrate; a time-division driving circuit disposed on the first principal surface side of the substrate, the time-division driving circuit outputting a light-emission control signal to the plurality of light-emitting portions via respective light-emission control signal lines in a time-division manner; at least one driving signal line disposed on a second principal surface side of the substrate, the at least one driving signal line feeding the light-emission control signal to the plurality of light-emitting portions via the time-division driving circuit; and at least one connection conductor disposed so as to extend from the first principal surface to the second principal surface, the at least one connection conductor electrically connecting the time-division driving circuit and the at least one driving signal line, a number of the at least one connection conductor being smaller than a number of the light-emission control signal lines by making electrically connecting the at least one connection conductor to the light-emission control signal lines.

In the display apparatus of the invention, it is preferable that the at least one connection conductor includes a through conductor disposed so as to pass through the substrate.

Moreover, in the display apparatus of the invention, it is preferable that the at least one connection conductor includes a side conductor disposed on a side surface of the substrate.

Moreover, in the display apparatus of the invention, it is preferable that the substrate comprises, on the first principal surface side of the substrate, a display section having the plurality of light-emitting portions, and the time-division driving circuit and the at least one connection conductor are disposed in the display section.

A display apparatus according to the invention comprises: a substrate having a first principal surface and a second principal surface opposite to the first principal surface; a plurality of scanning signal lines disposed on a first principal surface side of the substrate; at least one light-emission control signal line disposed on the first principal surface side of the substrate so as to intersect with the plurality of scanning signal lines; light-emitting portions assigned to parts of the at least one light-emission control signal line which intersects with the scanning signal lines; a scanning signal line driving circuit disposed on the first principal surface side of the substrate, the scanning signal line driving circuit driving the plurality of scanning signal lines; at least one first driving control signal line disposed on a second principal surface side of the substrate, the at least one first driving control signal line feeding a driving control signal to the scanning signal line driving circuit; and at least one connection conductive body disposed so as to extend from the first principal surface to the second principal surface, the at least one connection conductive body electrically connecting the scanning signal line driving circuit and the first driving control signal line, the at least one connection conductive body being electrically connected, via second driving control signal lines connected to the scanning signal line driving circuit, to the scanning signal line driving circuit, a number of the at least one connection conductive body being smaller than a number of the scanning signal lines by making a number of the second driving control signal lines smaller than a number of the scanning signal lines.

Moreover, in the display apparatus of the invention, it is preferable that the at least one connection conductive body includes a through conductor disposed so as to pass through the substrate.

Moreover, in the display apparatus of the invention, it is preferable that the at least one connection conductive body includes a side conductor disposed on a side surface of the substrate.

Moreover, in the display apparatus of the invention, it is preferable that the substrate comprises, on the first principal surface side of the substrate, a display section having the light-emitting portions, and the scanning signal line driving circuit and the at least one connection conductive body are disposed in the display section.

The display apparatus of the invention comprises: a substrate having a first principal surface and a second principal surface opposite to the first principal surface; a plurality of light-emitting portions disposed on a first principal surface side of the substrate; a time-division driving circuit disposed on the first principal surface side of the substrate, the time-division driving circuit outputting a light-emission control signal to the plurality of light-emitting portions via respective light-emission control signal lines in a time-division manner; at least one driving signal line disposed on a second principal surface side of the substrate, the at least one driving signal line feeding the light-emission control signal to the plurality of light-emitting portions via the time-division driving circuit; and at least one connection conductor disposed so as to extend from the first principal surface to the second principal surface, the at least one connection conductor electrically connecting the time-division driving circuit and the at least one driving signal line. A number of the at least one connection conductor is smaller than a number of the light-emission control signal lines by electrically connecting the at least one connection conductor to the light-emission control signal lines. The display apparatus thus constructed affords the following advantageous effects. That is, the number of the connection conductor is smaller than the number of the light-emission control signal lines by electrically connecting a single connection conductor to the light-emission control signal lines. Therefore, in contrast to the case of providing the light-emission control signal lines and the connection conductors on a single-connection conductor-per-light-emission control signal line basis, the number of the connection conductors can be greatly reduced. This permits remarkable simplification in wiring arrangement. Moreover, since the range of placement of the connection conductor is widened, the connection conductor and the light-emission control signal line are readily alignable with consequent enhancement of their connection. This makes it possible to input the light-emission control signal to the light-emitting portion without fail.

In the display apparatus of the invention, where the at least one connection conductor includes a through conductor disposed so as to pass through the substrate, by virtue of its high degree of flexibility in layout, the through conductor may be disposed in proximity to the time-division driving circuit, or may be included in the time-division driving circuit. This permits further simplification in wiring arrangement.

Moreover, in the display apparatus of the invention, where the at least one connection conductor includes a side conductor disposed on a side surface of the substrate, the condition of connection between the side conductor and other wiring can be checked with ease. This permits further enhancement in connection.

Moreover, in the display apparatus of the invention, where the substrate comprises, on the first principal surface side of the substrate, a display section having the plurality of light-emitting portions, and the time-division driving circuit and the at least one connection conductor are disposed in the display section, the number of the connection conductors can be greatly reduced, and also a bezel part located outside the display section in the first principal surface of the substrate can be greatly thin.

Moreover, the display apparatus of the invention comprises: a substrate having a first principal surface and a second principal surface opposite to the first principal surface; a plurality of scanning signal lines disposed on a first principal surface side of the substrate; at least one light-emission control signal line disposed on the first principal surface side of the substrate so as to intersect with the plurality of scanning signal lines; light-emitting portions assigned to parts of the at least one light-emission control signal line which intersects with the scanning signal lines; a scanning signal line driving circuit disposed on the first principal surface side of the substrate, the scanning signal line driving circuit driving the plurality of scanning signal lines; at least one first driving control signal line disposed on a second principal surface side of the substrate, the at least one first driving control signal line feeding a driving control signal to the scanning signal line driving circuit; and at least one connection conductive body disposed so as to extend from the first principal surface to the second principal surface, the at least one connection conductive body electrically connecting the scanning signal line driving circuit and the at least one first driving control signal line. The at least one connection conductive body is electrically connected, via second driving control signal lines connected to the scanning signal line driving circuit, to the scanning signal line driving circuit. a number of the at least one connection conductive body is smaller than a number of the scanning signal lines by making a number of the second driving control signal lines smaller than a number of the scanning signal lines. The display apparatus thus constructed affords the following advantageous effects. That is, there is provided the scanning signal line (gate signal line) driving circuit for sequentially driving the plurality of light-emitting portions arranged in a matrix (arranged in rows and columns) in a column direction, and, the scanning signal line driving circuit is disposed on a side of the substrate on which the light-emitting portions are mounted (the first principal surface side of the substrate) so as to be electrically connected to the first driving control signal line disposed on the back side of the substrate (the second principal surface side of the substrate) via the connection conductive body the number of which is far smaller than the number of the scanning signal lines. This permits remarkable simplification in wiring arrangement.

Moreover, in the display apparatus of the invention, where the at least one connection conductive body includes a through conductor disposed so as to pass through the substrate, as an advantageous effect, the through conductor provides greater flexibility in layout.

Moreover, in the display apparatus of the invention, where the substrate comprises, on the first principal surface side of the substrate, a display section having the light-emitting portions, and the scanning signal line driving circuit and the at least one connection conductive body are disposed in the display section, the number of the connection conductive bodies can be greatly reduced, and also a bezel part located outside the display section in the first principal surface of the substrate can be greatly thin.

Moreover, in the display apparatus of the invention, where the at least one connection conductive body includes a side conductor disposed on a side surface of the substrate, as an advantageous effect, the condition of connection between the side conductor and other wiring can be checked with ease.

BRIEF DESCRIPTION OF THE DRAWINGS

FIGS. 3A and 3B are views showing the display apparatus having the structure shown in FIG. 1, wherein FIG. 3A is a sectional view of the display apparatus taken along an image signal line (SL2), as viewed in a direction A shown in FIG. 1, and FIG. 3B is a side view of the display apparatus, as viewed in a direction B shown in FIG. 3A;

FIGS. 4A and 4B are views showing the display apparatus which has the structure shown in FIG. 1 and is yet provided with a side conductor in place of a through conductor, wherein FIG. 4A is a sectional view of the display apparatus taken along the image signal line (SL2), as viewed in the direction A, and FIG. 4B is a side view of the display apparatus, as viewed in a direction B shown in FIG. 4(a);

FIGS. 6A and 6B are views showing the display apparatus shown in FIG. 5, wherein FIG. 6A is a sectional view of the display apparatus taken along an image signal line (SL1), as viewed in a direction A shown in FIG. 5, and FIG. 6B is a side view of the display apparatus, looking in a direction B shown in FIG. 6A.

DETAILED DESCRIPTION

Figure 1:
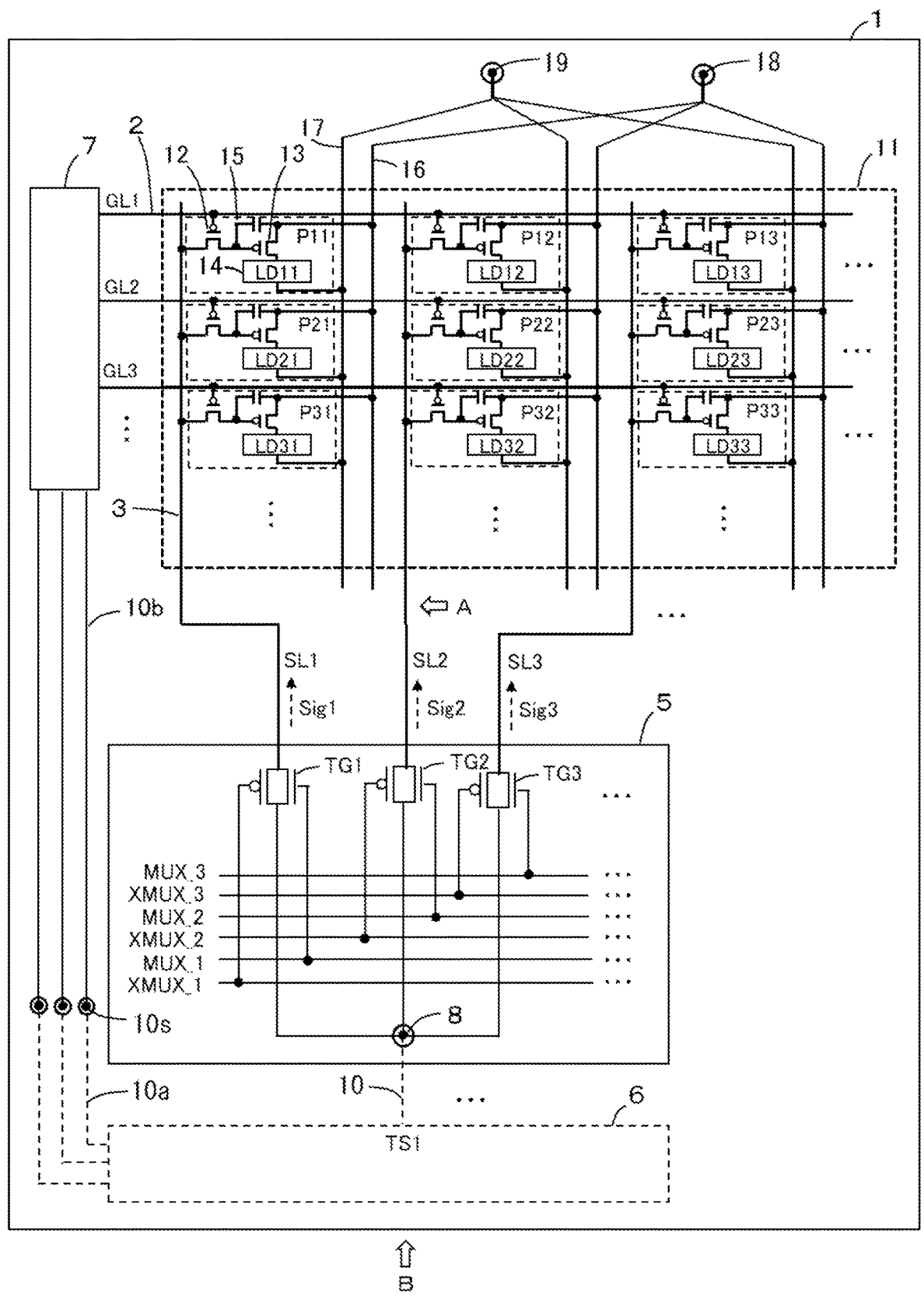
FIG. 1 is a block circuit diagram of an embodiment of a display apparatus according to the invention, illustrating the basic structure of the display apparatus.

Now referring to the drawings, embodiments of a display apparatus according to the invention will be described below. The drawings to be referred to hereinafter, which are drawings for the purpose of explanation of the display apparatus of the invention, show only principal parts of members constituting the embodiments of the display apparatus of the invention. Thus, although not shown in the drawings, the display apparatus of the invention may comprise other heretofore known constituent members, such as a circuit board, a wiring conductor, a control IC, and LSI.

FIGS. 1 to 4B are views showing various embodiments of a display apparatus according to the invention. As shown in these drawings, the display apparatus of the invention comprises: a substrate 1 having a first principal surface 1a and a second principal surface 1b opposite to the first principal surface 1a; a plurality of light-emitting portions (also referred to as pixel portions) 15 disposed on the first principal surface 1a side of the substrate 1; a time-division driving circuit 5 disposed on the first principal surface 1a side of the substrate 1, the time-division driving circuit 5 outputting a light-emission control signal to each of the plurality of light-emitting portions 15 via a light-emission control signal line (also referred to as an image signal line) 3 in a time-division manner; a driving signal line 10 disposed on the second principal surface 1b side of the substrate 1, the driving signal line 10 feeding the light-emission control signal to the plurality of light-emitting portions 15 via the time-division driving circuit 5; and a through conductor 8 serving as a connection conductor disposed so as to extend from the first principal surface 1a to the second principal surface 1b, the through conductor 8 electrically connecting the time-division driving circuit 5 and the driving signal line 10. In this construction, the number of the through conductors 8 are smaller than the number of the light-emission control signal lines 3 by electrically connecting a single through conductor 8 to the plurality of light-emission control signal lines 3. Although a driving device 6 which is connected to the driving signal line 10 is disposed on the second principal surface 1b side of the substrate 1, the driving device 6 may be omitted from the construction. In this case, the driving signal line 10 is electrically connected to a circuit board such as FPC.

The display apparatus thus constructed of the invention affords the following advantageous effects. That is, the number of the through conductors 8 are smaller than the number of the light-emission control signal lines 3 by electrically connecting a single through conductor 8 to the plurality of light-emission control signal lines 3. In this case, in contrast to the case of providing the light-emission control signal lines 3 and the through conductors 8 on a single-through conductor-per-light-emission control signal line basis, the number of the through conductors 8 can be greatly reduced. This permits remarkable simplification in wiring arrangement. Moreover, the range of placement of the through conductor 8 can be widened, and thus the through conductor 8 and the image signal line (SL) serving as the light-emission control signal line 3 are readily alignable with consequent enhancement of their connection. This makes it possible to input a light-emission control signal to the light-emitting portion 15 without fail.

Moreover, as shown in FIG. 1, the display apparatus of the invention comprises: a substrate 1 having a first principal surface 1a and a second principal surface 1b opposite to the first principal surface 1a; a plurality of scanning signal lines (also referred to as gate signal lines) 2 disposed on the first principal surface 1a side of the substrate 1; a light-emission control signal line 3 disposed on the first principal surface 1a side of the substrate 1 so as to intersect with the plurality of scanning signal lines 2; light-emitting portions 15 assigned to parts of intersection of the scanning signal lines 2 and the light-emission control signal line 3; a scanning signal line driving circuit (also referred to as a gate signal line driving circuit) 7 disposed on the first principal surface 1a side of the substrate 1, the scanning signal line driving circuit 7 driving a plurality of the scanning signal lines 2; a first driving control signal line 10a disposed on the second principal surface 1b side of the substrate 1, the first driving control signal line 10a feeding a driving control signal to the scanning signal line driving circuit 7; and a through conductor 10s serving as a connection conductive body disposed so as to extend from the first principal surface 1a to the second principal surface 1b, the through conductor 10s electrically connecting the scanning signal line driving circuit 7 and the first driving control signal line 10a. In this construction, the through conductor 10s is electrically connected, via each of second driving control signal lines 10b connected to the scanning signal line driving circuit 7, to the scanning signal line driving circuit 7. The number of the second driving control signal lines 10b are smaller than the number of the scanning signal lines 2, from which it follows that the number of the through conductors 10s are smaller than the number of the scanning signal lines 2.

Figure 5:
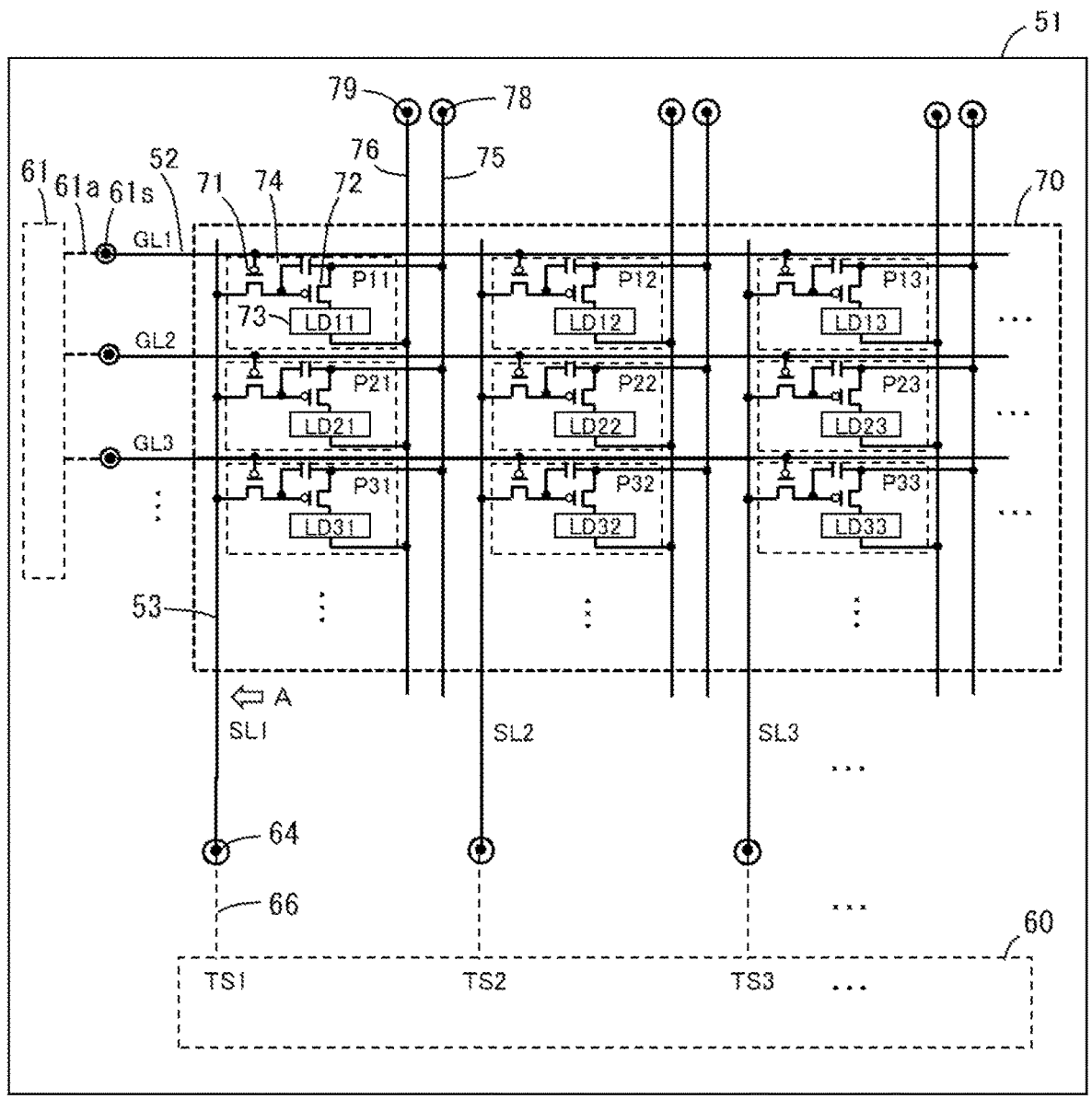
FIG. 5 is a block circuit diagram of an example of a display apparatus of conventional design, illustrating the basic structure of the display apparatus.
Figure 6A:
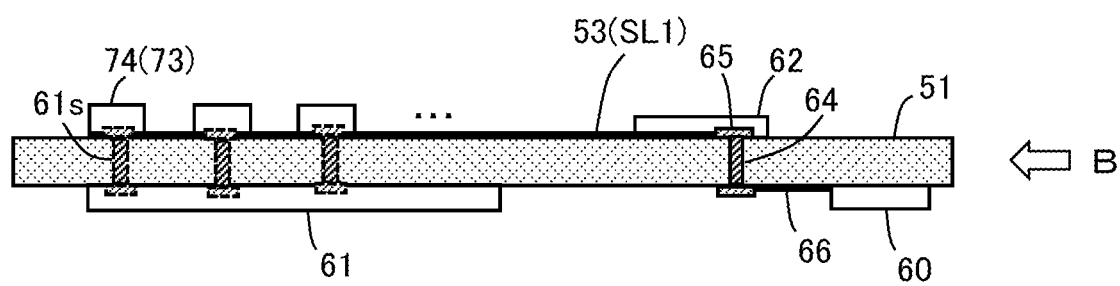
Figure 6B:
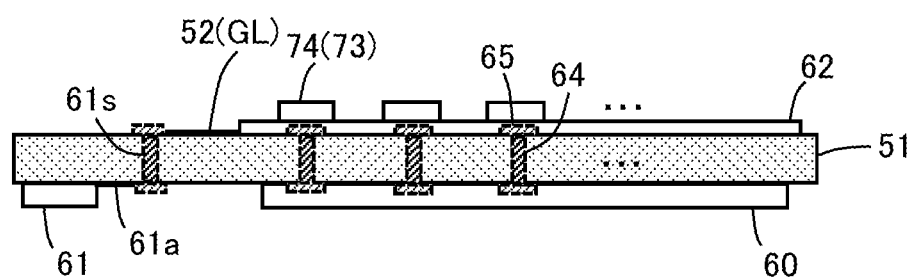

In this case, the following advantageous effects can be attained. That is, in contrast to the conventional design shown in FIG. 5, there is provided the scanning signal line driving circuit 7 for sequentially driving the plurality of light-emitting portions 15 arranged in a matrix (arranged in rows and columns) in a column direction. The scanning signal line driving circuit 7 is disposed on a side of the substrate 1 on which the light-emitting portions 15 are mounted (the first principal surface 1a side of the substrate 1) so as to be electrically connected to the first driving control signal line 10a disposed on the back side of the substrate 1 (the second principal surface 1b side of the substrate 1) via the through conductors 10s the number of which are far smaller than the number of the scanning signal lines 2. More specifically, the scanning signal line driving circuit 7 is electrically connected, via the second driving control signal line 10b and the through conductor 10s disposed on that side of the substrate 1 on which the light-emitting portions 15 are mounted, to the first driving control signal line 10a disposed on the back side of the substrate 1, and, the second driving control signal lines 10b, the through conductors 10s, and the number of the first driving control signal lines 10a are far smaller than the number of the scanning signal lines 2. The scanning signal lines 2 range in number from several hundred to several thousand, whereas the second driving control signal lines 10b, in the form of a driving start line, a power supply line, etc. for controlling the scanning signal line driving circuit 7, are as small as five or less in number. That is, in the scanning signal line driving circuit 7, upon receiving a driving start signal via the second driving control signal line 10b, a shift register incorporated in the scanning signal line driving circuit 7 sequentially transfers the driving start signal to each of the plurality of scanning signal lines 2. For this reason, the number of the second driving control signal lines 10b are far smaller than the number of the scanning signal lines 2. The above-described construction permits further simplification in wiring arrangement. For example, the scanning signal line driving circuit 7 is composed of a TFT comprising a LTPS-made semiconductor film. Instead of the through conductor 10s, a side conductor may be adopted for use as the connection conductive body.

In the presence of the driving device 6, the first driving control signal line 10a is connected to the driving device 6. In the absence of the driving device 6, the first driving control signal line 10a may be connected to a circuit board such as FPC.

FIG. 1 is a block circuit diagram of an embodiment of the display apparatus of the invention, illustrating the basic structure of the display apparatus. In FIG. 1, there are shown three light-emitting portions (pixel portions) 15, each including the light-emitting device 14, aligned in the first direction (aligned in a row), as well as aligned in the second direction (aligned in a column), or a total of nine light-emitting portions 15 (P11, P12, P13 . . . P33) and nine light-emitting devices 14 in all arranged in a 3 by 3 matrix. However, of all the light-emitting portions 15, those shown in FIG. 1 are only part thereof, and the rest is omitted. This display apparatus comprises a substrate 1 composed of, for example, a glass substrate, on which are arranged many light-emitting portions (pixel portions) 15, each including a TFT 12 which serves as a switching device for inputting light emission signals to corresponding one of light-emitting devices 14 (LD11, LD12, LD13, LD21, LD22, LD23, LD31, LD32, LD33) and a TFT 13 which serves as a driving device for effecting current drive to the light-emitting device 14 on the basis of a potential difference between positive voltage (anode voltage of about 3 to 5 V) and negative voltage (cathode voltage of about −3 to 0 V) (light emission signal) responsive to the level (voltage) of a light-emission control signal (a signal which is transmitted through an image signal line SL).

The TFT 12 and the TFT 13 are each a p-channel TFT. Inputting of a low (L signal) to their gate electrodes effects source-to-drain conduction, thus switching the TFT to the ON state for the passage of electric current. A light-emission control signal is inputted to a gate electrode of the TFT 13, and, a potential difference responsive to the level of the light-emission control signal (light emission signal) is applied across the positive electrode (anode electrode) and the negative electrode (cathode electrode) of the light-emitting device 14. A positive voltage is inputted via a positive-voltage input line 16 to the positive electrode of the light-emitting device 14, and, a negative voltage is inputted via a negative-voltage input line 17 to the negative electrode of the light-emitting device 14. At the input end of the positive-voltage input line 16, there is provided a through conductor 18 comprising a through hole, etc. via which the positive-voltage input line 16 is electrically connected to a driving device 6 or a power supply section, etc. disposed on the back side of the substrate 1. At the input end of the negative-voltage input line 17, there is provided a through conductor 19 comprising a through hole, etc. via which the negative-voltage input line 17 is electrically connected to the driving device 6 or the power supply section, etc. disposed on the back side of the substrate 1. The TFT 13 is maintained in the ON state during the time when the L signal is inputted to the gate electrode to allow the passage of electric current through the light-emitting device 14. On a connection line for providing connection between the gate electrode and the source electrode of the TFT 13, there is provided a capacitive element which serves as a retention capacity for retaining the voltage of the light-emission control signal inputted to the gate electrode of the TFT 13 over a certain period of time until initiation of succeeding rewriting operation (one-frame period).

As shown in FIG. 1, the display apparatus of the invention is preferably designed so that a plurality of positive-voltage input lines 16 are connected to a single through conductor 18. In this case, the number of the through conductors 18 can be greatly reduced with consequent simplification in wiring arrangement. Moreover, as shown in FIG. 1, a plurality of negative-voltage input lines 17 are preferably connected to a single through conductor 19. Also in this case, the number of the through conductors 19 can be greatly reduced with consequent simplification in wiring arrangement.

Moreover, on the substrate 5, there are provided a plurality of gate signal lines 2 (GL1, GL2, GL3) each extending in the first direction (row direction, for example), a plurality of image signal lines (source signal lines) 3 (SL1, SL2, SL3) each extending in the second direction (column direction, for example) perpendicular to the first direction so as to intersect with the gate signal lines 2, and the pixel portions 15 each assigned to a part of intersection of the gate signal line 2 and the image signal line 3. In FIG. 1, reference numeral 11 denotes a display section, and reference numeral 6 denotes a driving device for driving the image signal line 3 via a through conductor 8 comprising a through hole, etc., and also driving the gate signal line 2 via a through conductor 10s. Reference numeral 10 denotes a driving signal line for electrically connecting an image signal input terminal (TS1 . . . ) of the driving device 6 and the through conductor 8. For example, the driving device 6 is mounted on the back side of the substrate 1 by means of COG or otherwise. Moreover, the back side of the substrate 1 may be provided with FPC for the inputting and outputting of a driving signal, a control signal, etc. between the substrate and the driving device 6 via a lead wire.

For example, the TFT 12 and the TFT 13 comprise a semiconductor film formed of amorphous silicon (a-Si), LIPS (Low-Temperature Poly Silicon), etc., and has three terminals, namely a gate electrode, a source electrode, and a drain electrode. The TFT serves as a switching device (transfer gate device) in which electric current passes through the semiconductor film (channel) between the source electrode and the drain electrode under application of a voltage of predetermined potential to the gate electrode. In cases where the substrate 1 is composed of a glass substrate, and the driving device 6, the gate signal line driving circuit 7, and the image signal line driving circuit 5 are each composed of a TFT comprising a LIPS-made semiconductor film, preferably, the TFT can be formed directly on the substrate 1 by a thin-film forming process such as CVD (Chemical Vapor Deposition).

From the through conductor 8 disposed in the image signal line driving circuit 5, a light-emission control signal is inputted, via the image signal line 3, to each light-emitting portion 15. A single through conductor 8 is assigned to three image signal lines 3. Moreover, the driving device 6 has image signal input terminals (TS1 . . . ) corresponding to the individual through conductors 8, respectively. From the through conductor 8 disposed in the image signal line driving circuit 5, light-emission control signals Sig1, Sig2, and Sig3 are inputted, via the image signal lines 3, to the light-emitting portions 15, respectively.

As shown in FIG. 1, CMOS transfer gate devices TG1, TG2, and TG3 are connected to input ends of the image signal lines 3, respectively. The source electrodes of, respectively, the CMOS transfer gate devices TG1, TG2, and TG3 are connected, via the through conductor 8, to the common image signal input terminal TS1 of the driving device 6. As shown in FIG. 3, there is provided a connection portion 9 for electrically connecting the image signal input terminal TS1 of the driving device 6 and the through conductor 8 disposed in the image signal line driving circuit (equivalent to the time-division driving circuit of the invention) 5. Moreover, the drain electrodes of the CMOS transfer gate devices TG1, TG2, and TG3 are connected to the image signal lines SL1, SL2, and SL3, respectively.

The CMOS transfer gate devices TG1, TG2, and TG3 each comprise a p-channel TFT and an n-channel TFT, and the CMOS transfer gate devices TG1, TG2, and TG3 are configured so that a source electrode of the p-channel TFT and a source electrode of the n-channel TFT are commonly connected and a drain electrode of the p-channel TFT and a drain electrode of the n-channel TFT are commonly connected, and a gate electrode of the p-channel TFT and a gate electrode of the n-channel TFT serve as control input electrodes. That is, inputting of a low (L) signal and a high (H) signal to the gate electrode of the p-channel TFT and the gate electrode of the n-channel TFT, respectively, allow electric current to pass between the source electrode and the drain electrode, thus permitting image signal input.

Moreover, symbols MUX1, XMUX1, MUX2, XMUX2, MUX3, and XMUX3 denote time-division signal input lines for effecting time-division drive to the image signal lines SL1, SL2, and SL3. The time-division signal input line MUX1 is connected to the gate electrode of the n-channel TFT of the CMOS transfer gate device TG1, and the time-division signal input line XMUX1 (signal line reversed from MUX1) is connected to the gate electrode of the p-channel TFT of the CMOS transfer gate device TG1. Upon inputting a H signal and a L signal to the time-division signal input line MUX1 and the time-division signal input line XMUX1, respectively, the image signal Sig1 inputted from the image signal input terminal TS1 is transmitted through the image signal line SL1. At this time, when the gate signal line GL1 is selected, the image signal Sig1 is inputted to the light-emitting device LD11. Likewise, when the gate signal line GL2 is selected, the image signal Sig1 is inputted to the light-emitting device LD21, and, when the gate signal line GL3 is selected, the image signal Sig1 is inputted to the light-emitting device LD31.

The time-division signal input line MUX2 is connected to the gate electrode of the n-channel TFT of the CMOS transfer gate device TG2, and the time-division signal input line XMUX2 (signal line reversed from MUX2) is connected to the gate electrode of the p-channel TFT of the CMOS transfer gate device TG2. Upon inputting a H signal and a L signal to the time-division signal input line MUX2 and the time-division signal input line XMUX2, respectively, the image signal Sig2 inputted from the image signal input terminal TS1 is transmitted through the image signal line SL2. At this time, when the gate signal line GL1 is selected, the image signal Sig2 is inputted to the light-emitting device LD12. Likewise, when the gate signal line GL2 is selected, the image signal Sig2 is inputted to the light-emitting device LD22, and, when the gate signal line GL3 is selected, the image signal Sig2 is inputted to the light-emitting device LD32.

The time-division signal input line MUX3 is connected to the gate electrode of the n-channel TFT of the CMOS transfer gate device TG3, and the time-division signal input line XMUX3 (signal line reversed from MUX3) is connected to the gate electrode of the p-channel TFT of the CMOS transfer gate device TG3. Upon inputting a H signal and a L signal to the time-division signal input line MUX3 and the time-division signal input line XMUX3, respectively, the image signal Sig3 inputted from the image signal input terminal TS1 is transmitted through the image signal line SL3. At this time, when the gate signal line GL1 is selected, the image signal Sig3 is inputted to the light-emitting device LD13. Likewise, when the gate signal line GL2 is selected, the image signal Sig3 is inputted to the light-emitting device LD23, and, when the gate signal line GL3 is selected, the image signal Sig3 is inputted to the light-emitting device LD33. In this construction, a single through conductor 8 is electrically connected to each of two or more light-emitting portions 15 aligned in a direction along the gate signal line 2 (aligned in a row), and thus the number of the through conductors 8 are smaller than the number of the light-emitting portions 15.

For example, the time-division signal input lines MUX1, XMUX1, MUX2, XMUX2, MUX3, and XMUX3 are electrically connected, via a through conductor or a side conductor, to the driving device 6.

Moreover, as the light-emitting devices LD11 to LD33, a device of self-emitting type, such as a microchip light emitting diode (LED), a monolithic light emitting diode, an organic EL, an inorganic EL, or a semiconductor laser device can be adopted.

In the display apparatus of the invention, the connection portion 9 is, for example, a conductor pad formed of a conductor material such as copper (Cu), aluminum (Al), silver (Ag), or gold (Au), and is formed by a thin-film forming process such as plating, evaporation, or CVD, or a thick-film forming process which involves print-coating of a conductor paste with subsequent firing.

The display apparatus of the invention may be built as a large-size combined display apparatus, or a so-called multi-display composed of a plurality of substrates 1 as shown in FIG. 1, each installed with a plurality of light-emitting devices 14, arranged (tiled) in a matrix on the same plane, with their side surfaces joined together by an adhesive, etc.

Figure 2:
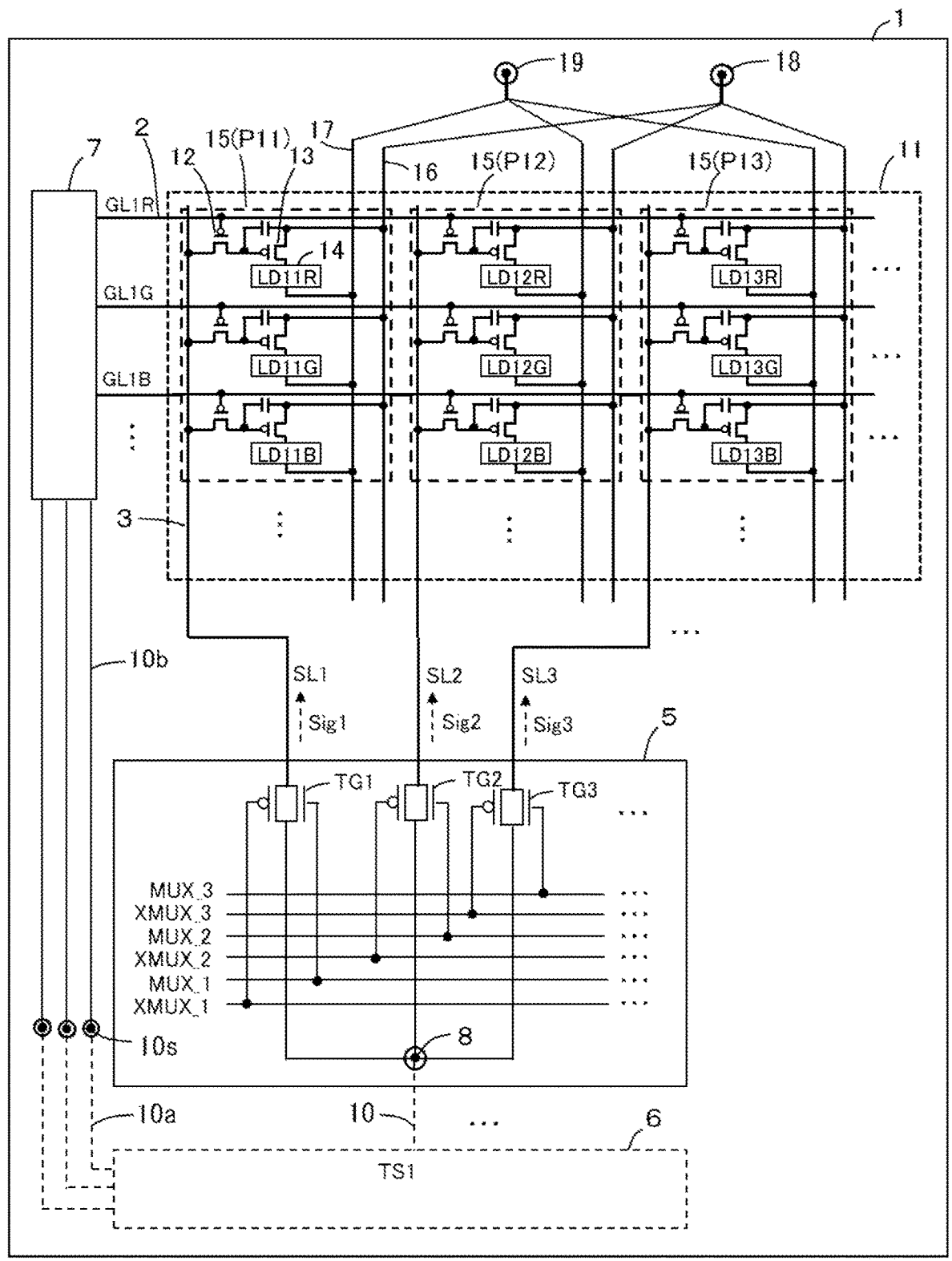
FIG. 2 is a block circuit diagram of another embodiment of the display apparatus according to the invention, illustrating the basic structure of the display apparatus.

FIG. 2 is a block circuit diagram of another embodiment of the display apparatus of the invention, illustrating the basic structure of the display apparatus. As shown in FIG. 2, the pixel portions 15 serving also as light-emitting portions may include a subpixel for red light emission, a subpixel for green light emission, and a subpixel for blue light emission, respectively. In this case, the display apparatus is capable of displays in full color. The subpixel for red light emission comprises a red light-emitting device composed of a red LED, etc. (for example, LD11R), the subpixel for green light emission comprises a green light-emitting device composed of a green LED, etc. (for example, LD11G), and the subpixel for blue light emission comprises a blue light-emitting device composed of a blue LED, etc. (for example, LD11B). Although these subpixels (for example, LD11R, LD11G, and LD11B) are aligned in a column, they may be aligned in a row instead.

In the construction shown in FIG. 2, the pixel portion 15 (P11) is actuated in the following manner. As a first step, an image signal Sig1 is inputted to the light-emitting device LD11R when a gate signal line GL1R is selected, with the CMOS transfer gate device TG1 maintained in the ON state. Then, an image signal Sig1 is inputted to the light-emitting device LD11G when a gate signal line GL1G is selected, with the CMOS transfer gate device TG1 maintained in the ON state. Then, an image signal Sig1 is inputted to the light-emitting device LD11B when a gate signal line GL1B is selected, with the CMOS transfer gate device TG1 maintained in the ON state. At this time, the image signal Sig1 corresponds to each of the light-emitting devices LD11R, LD11G, and LD11B. Moreover, at this time, the other CMOS transfer gate devices TG2 and TG3 are maintained in the OFF state.

Next, the pixel portion 15 (P12) is actuated. As a first step, an image signal Sig2 is inputted to a light-emitting device LD12R when the gate signal line GL1R is selected, with the CMOS transfer gate device TG2 maintained in the ON state. Then, an image signal Sig2 is inputted to a light-emitting device LD12G when the gate signal line GL1G is selected, with the CMOS transfer gate device TG2 maintained in the ON state. Then, an image signal Sig2 is inputted to a light-emitting device LD12B when the gate signal line GL1B is selected, with the CMOS transfer gate device TG2 maintained in the ON state. At this time, the image signal Sig2 corresponds to each of the light-emitting devices LD12R, LD12G, and LD12B. Moreover, at this time, the other CMOS transfer gate devices TG1 and TG3 are maintained in the OFF state.

Next, the pixel portion 15 (P13) is actuated. As a first step, an image signal Sig3 is inputted to a light-emitting device LD13R when the gate signal line GL1R is selected, with the CMOS transfer gate device TG3 maintained in the ON state. Then, an image signal Sig3 is inputted to a light-emitting device LD13G when the gate signal line GL1G is selected, with the CMOS transfer gate device TG3 maintained in the ON state. Then, an image signal Sig3 is inputted to a light-emitting device LD13B when the gate signal line GL1B is selected, with the CMOS transfer gate device TG3 maintained in the ON state. At this time, the image signal Sig3 corresponds to each of the light-emitting devices LD13R, LD13G, and LD13B. Moreover, at this time, the other CMOS transfer gate devices TG1 and TG2 are maintained in the OFF state.

Following the completion of actuation of all of the pixel portions 15 aligned in the first row, the actuation of all of the pixel portions aligned in a succeeding row located downstream of the first row in the column direction is started. By repeating such an actuation process, one-screen (one-frame) operation is completed.

Figure 3A:
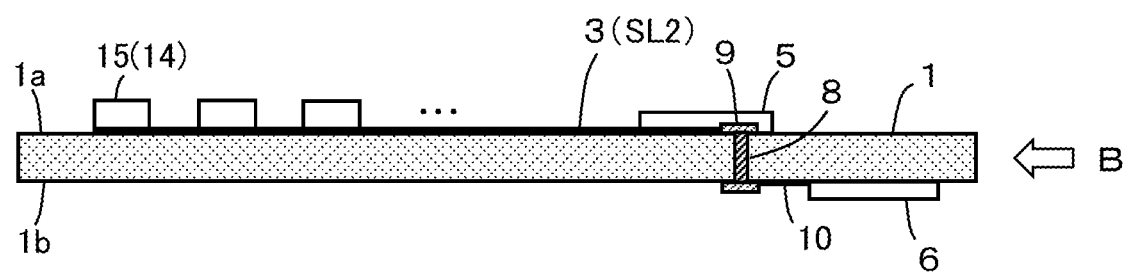
Figure 3B:
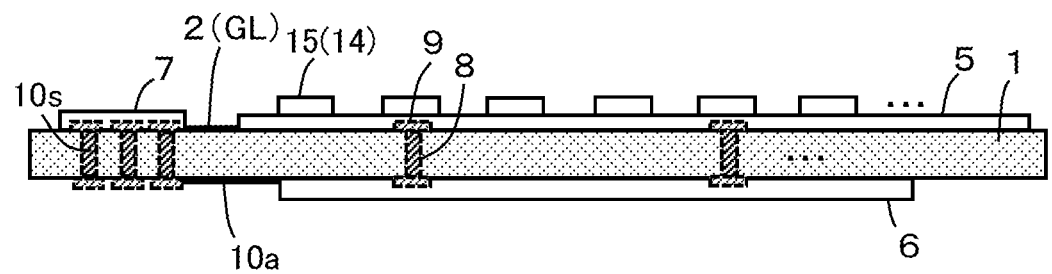

FIGS. 3A and 3B are views showing the display apparatus having the structure shown in FIG. 1, wherein FIG. 3A is a sectional view of the display apparatus taken along the image signal line 3 (SL2), as viewed in the direction A shown in FIG. 1, and FIG. 3B is a side view of the display apparatus, as viewed in a direction B shown in FIG. 3A. The driving device 6 is disposed on the second principal surface 1b side of the substrate 1 so as to be electrically connected, via the driving signal line 10, to the through conductor 8. As shown in FIGS. 3A and 3B, a single through conductor 8 is assigned to one group of the light-emitting devices (LD11, LD12, LD13, LD21, LD22, LD23, LD31, LD32, LD33). Thus, in contrast to the case of providing the light-emitting devices 14 and the through conductors 8 on a single-through conductor-per-light-emitting device basis, the number of the through conductors 8 can be greatly reduced. Moreover, by virtue of its high degree of flexibility in layout, the through conductor 8 may be disposed in proximity to the time-division driving circuit 5, or may be included in the time-division driving circuit 5. This permits further simplification in wiring arrangement.

The through conductor 8 is obtained by forming a through hole in the substrate 1 by means of lasering, etching, or otherwise, and thereafter forming a film of a conductor layer on the side surface of the through hole by a thin-film forming process such as plating, evaporation, or CVD. Alternatively, for example, the through conductor 8 may be formed by a thick-film forming process which involves filling of a conductor paste in a through hole with subsequent firing to produce a columnar conductor. Moreover, the through conductor 8 is formed of a conductor material such as copper (Cu), aluminum (Al), silver (Ag), or molybdenum (Mo). In the case of forming a through hole in the substrate 1 by lasering, for example, a photosensitive glass substrate is desirable for use as the substrate 1. This makes it possible to easily form a through hole in the light-transmittable substrate 1.

It is preferable that, in the display apparatus of the invention, the connection portion 9 is formed so as to cover the through conductor 8 connected thereto in a plan view. This allows, even if the through conductor 8 is displaced due to a production error, the connection portion 9 and the through conductor 8 to be connected together with reliability. It is advisable that the connection portion 9 has a maximum width between 1.5 and 3 times greater than the maximum width (about 50 to 100 μm) of the through conductor 8 in a plan view. When the lower limit of the range is less than 1.5 times, the connecting together of the connection portion 9 and the through conductor 8 in properly conducting relation tends to be difficult when production error-caused displacement of the through conductor 8 is encountered. On the other hand, when the upper limit is greater than 3 times, due to too large a connection portion 9 size, adjacent components tend to make contact with each other with the consequent risk of electrical short-circuiting. Moreover, it is preferable that the center of the connection portion 9 coincides with the center of the through conductor 8 in a plan view. This allows, even if the through conductor 8 is displaced due to a production error, the connection portion 9 and the through conductor 8 to be connected together with a higher degree of reliability. For example, where the through conductor is circular in a plan view, the connection portion 9 is circular-shaped concentric with the through conductor 8, and, the connection portion 9 is preferably configured to have a diameter between 1.5 and 3 times greater than the diameter of the through conductor 8.

Figure 4A:
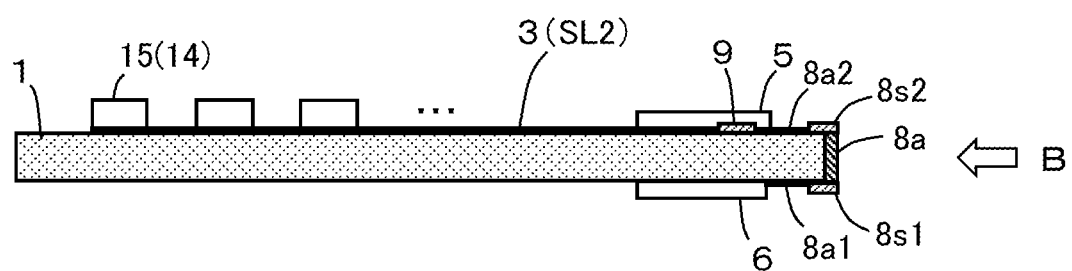
Figure 4B:
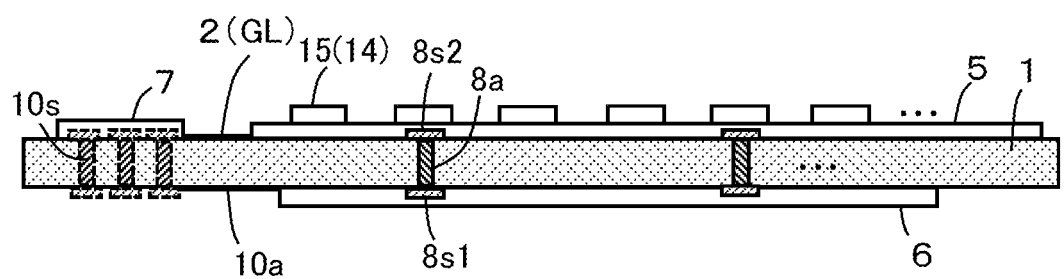

FIGS. 4A and 4B are views showing the display apparatus which has the structure shown in FIG. 1 and is yet provided with a side conductor 8a in place of the through conductor 8, wherein FIG. 4A is a sectional view of the display apparatus taken through the image signal line 3 (SL2), as viewed in the direction A shown in FIG. 1, and FIG. 4B is a side view of the display apparatus, as viewed in a direction B shown in FIG. 4A. For example, the side conductor 8a is obtained by forming a film of a conductor layer at a predetermined location of the side surface of the substrate 1 by a thin-film forming process such as plating, evaporation, or CVD. Alternatively, for example, the side conductor 8a may be obtained by forming a groove at a predetermined location of the side surface of the substrate 1 by means of etching or otherwise, and thereafter forming a film of a conductor layer in the groove by a thin-film forming process such as plating, evaporation, or CVD. In another alternative, for example, the side conductor 8a may be formed by a thick-film forming process which involves application of a conductor paste to a predetermined location of the side surface of the substrate 1 with subsequent firing to produce a conductor layer. In still another alternative, for example, the side conductor 8a may be formed by a thick-film forming process which involves formation of a groove at a predetermined location of the side surface of the substrate 1 by means of etching or otherwise, and application of a conductor paste to the groove with subsequent firing to produce a conductor layer.

The side conductor 8a is formed of a conductor material such as copper (Cu), aluminum (Al), silver (Ag), or molybdenum (Mo). Moreover, the side conductor 8a has a width of about 10 μm to 1000 μm. The side conductor 8a is electrically connected, via a connection line 8a1, to the driving device 6, and is also electrically connected, via a connection line 8a2, to the image signal line driving circuit 5.

In the display apparatus having the structure shown in FIGS. 4A and 4B, a connection portion 8s1 for providing connection between the side conductor 8a and the connection line 8a1, and a connection portion 8s2 for providing connection between the side conductor 8a and the connection line 8a2 are each preferably formed so as to cover the side conductor 8a in a plan view. This allows, even if the side conductor 8a is displaced due to a production error, the connection portion 8s1, 8s2 and the side conductor 8a to be connected together with reliability. It is advisable that the connection portion 8s1, 8s2 has a maximum width between greater than 1 and 3 or less times greater than the maximum width (about 100 μm) of the side conductor 8a in a plan view. When the lower limit of the range is 1 or less times, the connecting together of the connection portion 8s1, 8s2 and the side conductor 8a in properly conducting relation tends to be difficult when production error-caused displacement of the side conductor 8a is encountered. On the other hand, when the upper limit is greater than 3 times, due to too large a connection portion 8s1, 8s2 size, adjacent components tend to make contact with each other with the consequent risk of electrical short-circuiting.

Figure 7:
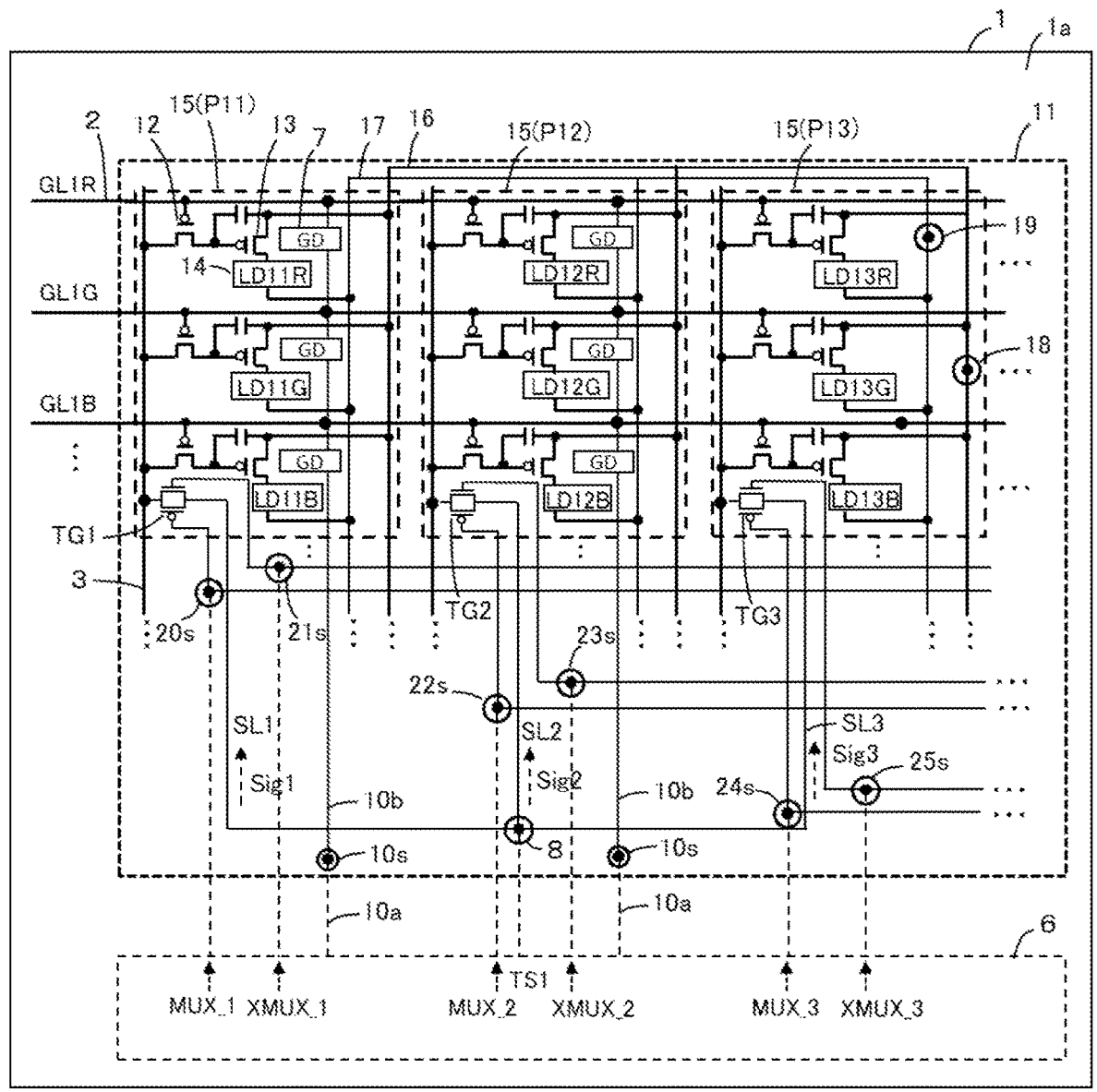
FIG. 7 is a block circuit diagram of still another embodiment of the display apparatus according to the invention, illustrating the basic structure of the display apparatus.

Moreover, in the display apparatus of the invention, as shown in FIG. 7, it is preferable that the substrate 1 comprises, on the first principal surface 1a side of the substrate 1, a display section 11 having the plurality of light-emitting portions 14, and the time-division driving circuit and through conductors 8, 20s, 21s, 22s, 23s, 24s, and 25s serving as the connection conductor are disposed in the display section 11. In this case, the number of the through conductors (8, 20s, 21s, 22s, 23s, 24s, 25s) can be greatly reduced, and also a bezel part located outside the display section 11 in the first principal surface 1a of the substrate 1 can be greatly thin.

Moreover, in the display apparatus of the invention, as shown in FIG. 7, it is preferable that the substrate 1 comprises, on the first principal surface 1a side of the substrate 1, the display section 11 having the plurality of light-emitting portions 15, and the scanning signal line driving circuit 7 and the through conductors 10s serving as the connection conductive body are disposed in the display section 11. In this case, the number of the through conductors (10s) can be greatly reduced, and also the bezel part located outside the display section 11 in the first principal surface 1a of the substrate 1 can be greatly thin.

Moreover, in the display apparatus of the invention, as shown in FIG. 7, it is preferable that a through conductor 18 for inputting a positive voltage to a positive-voltage input line 16 and a through conductor 19 for inputting a negative voltage to a negative-voltage input line 17 are disposed in the display section 11. In this case, the number of the through conductors for inputting a positive voltage to the light-emitting device 14 and the number of the through conductors for inputting a negative voltage to the light-emitting device 14 can be greatly reduced, and also the bezel part located outside the display section 11 in the first principal surface 1a of the substrate 1 can be greatly thin.

In the display apparatus of the invention shown in FIG. 7, the CMOS transfer gate devices TG1, TG2, and TG3 constituting the time-division driving circuit, the through conductor 8 connected to the CMOS transfer gate devices TG1, TG2, and TG3, the through conductors 20s and 21s connected to the CMOS transfer gate device TG1, the through conductors 22s and 23s connected to the CMOS transfer gate device TG2, and the through conductors 24s and 25s connected to the CMOS transfer gate device TG3 are disposed in the display section 11. The CMOS transfer gate device TG1 is located in the light-emitting portion (pixel portions) 15 (P11), the CMOS transfer gate device TG2 is located in the light-emitting portion (pixel portions) 15 (P12), and the CMOS transfer gate device TG3 are located in the light-emitting portion (pixel portions) 15 (P13). Note that a plurality of CMOS transfer gate devices may be connected in parallel with respect to a single light-emission control signal line 3. In this case, even with a low on-state current in the downsized transfer gate device, a decrease in current value of a light-emission control signal can be suppressed.

Moreover, in the display apparatus of the invention shown in FIG. 7, a scanning signal line driving circuit (GD) 7 and a through conductor 10s connected thereto are disposed in the display section 11. Although the scanning signal line driving circuit (GD) 7 is disposed in each of the light-emitting portions 15, it does not necessarily have to be disposed in each and every light-emitting portion 15. For example, placement of the scanning signal line driving circuit (GD) 7 in part of the light-emitting portions 15 makes it possible to apply a heretofore known construction for driving all of scanning signal lines (GL1R, GL1G, GL1B .

. . . ) (for example, the construction disclosed in Japanese Unexamined Patent Publication JP-A 2016-186649).

Moreover, the time-division driving circuit and the scanning signal line driving circuit (GD) 7 disposed in the display section 11 may be located either on the same layer as the light-emitting portion 15 or on a layer located below the light-emitting portion 15-carrying layer when viewed in section.

The display apparatus of the invention is not limited to the embodiments thus far described, and may thus be subjected to design modifications and improvements as appropriate. For example, while the substrate 1 may be of a transparent glass substrate, it may be of an opaque substrate instead. Examples of opaque substrates that can be used for the substrate 1 include a colored glass substrate, a glass substrate formed of ground glass, a plastic substrate, a ceramic substrate, a metallic substrate, and a multilayer substrate composed of a stack of substrates as mentioned above.

The display apparatus of the invention is applicable to various types of electronic equipment. Examples of electronic equipment to which the display apparatus is applicable include a large-size combined display apparatus (multi-display), an automotive route guidance system (car navigation system), a route guidance system for boats and ships, an aircraft route guidance system, a smartphone terminal, a mobile phone, a tablet terminal, a personal digital assistant (PDA), a video camera, a digital still camera, an electronic notepad, an electronic book, an electronic dictionary, a personal computer, a copier, a video-game machine terminal, a television set, a product indication tag, a price indication tag, an industrial programmable display, car audio equipment, a digital audio player, a facsimile, a printer, an automated teller machine (ATM), a vending machine, a digital wristwatch, and a smartwatch.

What is claimed is:

1. A display apparatus, comprising:
   a substrate having a first principal surface and a second principal surface opposite to the first principal surface;
   a plurality of light-emitting portions disposed on a first principal surface side of the substrate;
   a time-division driving circuit disposed on the first principal surface side of the substrate, the time-division driving circuit outputting a light-emission control signal to the plurality of light-emitting portions via respective light-emission control signal lines in a time-division manner;
   at least one driving signal line disposed on a second principal surface side of the substrate, the at least one driving signal line feeding the light-emission control signal to the plurality of light-emitting portions via the time-division driving circuit; and
   at least one connection conductor disposed so as to extend from the first principal surface to the second principal surface, the at least one connection conductor electrically connecting the time-division driving circuit and the at least one driving signal line, the at least one connection conductor including a side conductor disposed on a side surface of the substrate, the side surface being different from the first principal surface and the second principal surface,
   a number of the at least one connection conductor being smaller than a number of the light-emission control signal lines by electrically connecting the at least one connection conductor to the light-emission control signal lines.

2. The display apparatus according to claim 1, wherein the substrate comprises, on the first principal surface side of the substrate, a display section having the plurality of light-emitting portions, and
   the time-division driving circuit and the at least one connection conductor are disposed in the display section.

3. A display apparatus, comprising:
   a substrate having a first principal surface and a second principal surface opposite to the first principal surface;
   a plurality of scanning signal lines disposed on a first principal surface side of the substrate;
   at least one light-emission control signal line disposed on the first principal surface side of the substrate so as to intersect with the plurality of scanning signal lines;
   light-emitting portions assigned to parts of the at least one light-emission control signal line which intersects with the scanning signal lines;
   a scanning signal line driving circuit disposed on the first principal surface side of the substrate, the scanning signal line driving circuit driving the plurality of scanning signal lines;
   at least one first driving control signal line disposed on a second principal surface side of the substrate, the at least one first driving control signal line feeding a driving control signal to the scanning signal line driving circuit; and
   at least one connection conductive body disposed so as to extend from the first principal surface to the second principal surface, the at least one connection conductive body electrically connecting the scanning signal line driving circuit and the at least one first driving control signal line, the at least one connection conductive body including a side conductor disposed on a side surface of the substrate, the side surface being different from the first principal surface and the second principal surface,
   the at least one connection conductive body being electrically connected, via second driving control signal lines connected to the scanning signal line driving circuit, to the scanning signal line driving circuit, a number of the at least one connection conductive body being smaller than a number of the scanning signal lines by making a number of the second driving control signal lines smaller than a number of the scanning signal lines.

4. The display apparatus according to claim 3, wherein the substrate comprises, on the first principal surface side of the substrate, a display section having the light-emitting portions, and
   the scanning signal line driving circuit and the at least one connection conductive body are disposed in the display section.

* * * * *